(12) United States Patent
Danylenko et al.

(10) Patent No.: US 11,393,660 B2
(45) Date of Patent: Jul. 19, 2022

(54) GASIFICATION DEVICE AND PLASMA SHUTTER WITH A MICROWAVE PLAZMA SLOWING SYSTEM OF THE GASIFICATION DEVICE

(71) Applicant: INING S.R.O., Brno (CZ)

(72) Inventors: Anton Danylenko, Kharkov (UA); Petro Fisenko, Kiev (UA); Zbynek Slavik, Prague (CZ)

(73) Assignee: INING S.RO., Brno (CZ)

( * ) Notice: Subject to any disclaimer, the term of this patent is extended or adjusted under 35 U.S.C. 154(b) by 0 days.

(21) Appl. No.: 17/425,945

(22) PCT Filed: Jan. 23, 2020

(86) PCT No.: PCT/CZ2020/050002
§ 371 (c)(1),
(2) Date: Jul. 26, 2021

(87) PCT Pub. No.: WO2020/151774
PCT Pub. Date: Jul. 30, 2020

(65) Prior Publication Data
US 2022/0044910 A1    Feb. 10, 2022

(30) Foreign Application Priority Data
Jan. 25, 2019   (EP) .................................. 19153643

(51) Int. Cl.
*H01J 37/32*    (2006.01)
(52) U.S. Cl.
CPC .. *H01J 37/32229* (2013.01); *H01J 37/32275* (2013.01); *H01J 37/32449* (2013.01)

(58) Field of Classification Search
None
See application file for complete search history.

(56) References Cited

U.S. PATENT DOCUMENTS 3,814,983 A * 6/1974 Weissfloch ............ H01J 65/044
315/39

FOREIGN PATENT DOCUMENTS

| EP | 0502269 A1 | 9/1992 |
| EP | 2478955 A1 | 7/2012 |
| JP | 2003175094 A | 6/2003 |

* cited by examiner

*Primary Examiner* — Ram N Kackar
(74) *Attorney, Agent, or Firm* — PROI Intellectual Property US (57) ABSTRACT

Microwave plasma slowing system for a plasma shutter comprises a waveguide-band transmission for interconnection of the system with a generator, and for letting waves from the generator into the plasma shutter, a bridge band interconnected with the waveguide-band transmission, two parallel band waistlines, interconnected by its one end with the bridge band, where the band waistlines are flat plates, where one of its sides is provided with tenons arranged side by side along the axis of the band waistlines with orientation in a such way, that the tenons arranged on the one side of the first band waistline placed in turns between the tenons arranged on the one side of the second band waistline, where the band waistlines are provided at the other end by mutually separated lockable electromagnetic oscillators.

1 Claim, 4 Drawing Sheets

GASIFICATION DEVICE AND PLASMA SHUTTER WITH A MICROWAVE PLAZMA SLOWING SYSTEM OF THE GASIFICATION DEVICE

BACKGROUND OF THE INVENTION

The present invention concerns a gasification device and a plasma shutter with a microwave plazma slowing system of the gasification device.

STATE OF THE ART

Microwave plasma, also called UHF plasma, is a sum of discharges in waveguide devices, formed by electromagnetic waves with frequency higher than 300 MHz. It is necessary to know, that for industrial, medical and scientific purposes it is not possible to use each frequency, but 460, 915, 2450, 5800, 22125 MHz. The most popular frequency for mobile phones is 915 MHz and for microwave owns, wood drying and surface treatment of metal is 2450 MHz.

To create the UHF discharge a plasma generator has to be used. The device is also called a plasmatron, which is comprising a microwave generator for generating microwave energy, a waveguide system for supplying the microwave energy to a defined point, a plasma shutter, which is a termination device for transformation of electrical energy to electromagnetic and heating energy. All constructions of the UHF plasmatrons can be sorted to the following groups: plasma generators based on UHF transmitting lines, plasma generators based on the UHF generators, plasma generators based on "slow down structures", plasma generators, where feeding of energy to the plasma is divided, etc.

All methods for generating the UHF plasma has the same fundamental components, i.e. a generator of UHF frequency, a lamp called a magnetron and a waveguide device.

The above mentioned components enable the generator, which is basically connected to a device for supply a working, respectively plasma-generating gas, to generate electromagnetic field of voltage over 30 kV/cm$^2$, which creates discharge voltage and avalanche ionization of gas to create a plasma, by which an area, where the plasma is discharged is created, i.e. PLASMOID. The gas is for example air, vapour, inertial gas, etc.

Because flow of working gas is controlled the plasmoid is transformed to a form of plasma flow, which is directed over the border of the plasma shutter to ensure two effects: overheating and destruction of the plasma shutter is pretended and a powerful working tool is performed, which has an intensive and high temperature effect to organic and inorganic substances.

The UHF plasma is characterized by its high degree of transformation of electric energy to heat energy, which is not under 97-98%.

The plasma discharge in a form of continual plasma flow is forced from the plasma shutter to the reactor chamber by flow of a working gas, which is specifically controlled by external source. Because firm electromagnetic bounds in the plasma flow are directed backwards to the point, where the discharge is formed, the plasmoid doesn't touch the walls and components of the plasma-forming device, so erosion of construction materials is avoided. Longitude and size of the plasma flow inside the reactor chamber is controlled by enough amount of added plasma-forming, i.e. working, gas.

A principal difference between the microwave plasmatron and the other sources of high temperature is, that electrodes and additional combustion substances, e.g. gas, masut, oil, which pollute termination products of the gasification by dangerous particles, are not presented in there. It means, that processing of a material by the microwave plasma is nowadays the cleanest method both in an ecological point of view and possibility of use of termination products of the processing for any technological purposes.

The microwave plasma shutter uses working gas at atmospheric pressure, but it can be easy adapted for its transformation into the gas plasma flow both at lower and higher pressure.

The microwave plasmatron is a source of low-temperature plasma of temperature from 1400° C. to 4000° C. and can be used for different technological processes, which requires intensive thermal effect on material, e.g. pyrolysis, gasification of material or waste, melting and cutting of metal, treatment of the surface of metal, ignition in boilers of heating plants, production of vapor, etc.

The plasma process ensures high and effective temperature of processing, which are not possible to be reached by other heating method. Because of dissociation and ionization process the high temperature flow of gas is high-energetic, which ensures to accelerate the technological process of processing of waste by 20 to 50%, based on the type of used product. Uniqueness of the plasma process is its high selectivity to get a final product with a minimal production of secondary products. For example, by gasification of any organic substances in a plasma of air or water vapor, it is possible to get gas of higher content of flammable substances ($CO+H_2$), which doesn't present fenol or polycyclic hydrocarbon additives.

So, the gasification is a process of transformation of organic substances which contain carbon to flammable gas, by high temperature heating, i.e. where temperature is from 900° C. to 2000° C., without presence of oxygen. Summary and principals of processes performed during gasification/pyrolise, it means during the thermal decomposition, when a material is heated over limit of thermal stability of presented organic compounds in there, which leads to its fusion up to stable low-molecular products and solid residue, is called a thermochemical conversion. The final product of conversion of organic substances is carbon monoxide (CO) and hydrogen ($H_2$), i.e. fundamental ingredients of ignition components of a gaseous product, which is called a synthesis gas. Other components of the synthesis gas, which are produced during the process of gasification, is called balast, and with regards to its minimal impact to calorific value of the gas it is not usually taken into account.

The main advantage of the microwave plasma gasification technology compare to the method of direct combustion is low impact on environment. It is caused by the fact, that the gaseous components are presented in surroundings having high temperature and residual coefficient of oxygen from 0.2 to 0.3, which causes decomposition and dechlorisation of most dangerous components, e.g. dioxin, furan, polychlorbiphenyl, benzenepyrene and other polycyclic aromatic hydrocarbons. On contrary to the direct combustion method another advantage of the method is creation of smaller volume of gas, which has to be purified, and many times lower volume of slag. Furthermore, the residue of the slag doesn't consist carbon, i.e. soot. Because of that, expenses for the devices for purification of the gas before its release to atmosphere, and a device for debacterisation of solid secular waste, i.e. slag, is reduced. Compare to the price of such purification device as a part of an incineration plant, can be up to 50% of the whole expenses of the incineration plant.

It was confirmed by experience in practice, that effectivity of transformation of organic substances to fuel gas by artificial methane fermentation and compostation is many times lower than by the gasification process.

Nowadays, ways for utilization of municipal waste by the direct combustion and by the thermal decomposition by use of electrical plasma arc exists.

A device for combustion of waste is known in the state of the art, comprising a combustion chamber with a lit, a late-combustion chamber with a tube for inlet of air with a deflector and a spark extinguisher. Furthermore, it comprises incoming chambers for forming a direction of air flow, tanks for diesel and a diesel burner, which is connected to the combustion chamber. Disadvantage of the device is use of a motor diesel, where further combustion products are formed, which pollute the environment and requires further expenses for its cleaning before released into the atmosphere.

Another known device according to the state of the art for combustion of a solid municipal waste and a medical waste is a neutralizer of a solid municipal waste. During combustion a pulsation combustion technology is used, which has better burning in total and better degree of oxidation of gas than the direct combustions. Disadvantage of the method, by which the problem of total burning of waste is solved is, that irreplaceable natural source of diesel is used as a product for refining of petroleum, and later on the final product is polluted, which involves additional indispensable filtration.

Another known device is a device for utilization of waste, which comprises a thermoreactor, a vertical cyclone oven with a late-combustion chamber, having a heating chamber in the upper part of a burner, where a chamber for thermic destruction is placed. Furthermore, the device comprises a catalytic converter, i.e. a combustor, a heat exchanger, a system for purification of gas, a device for suction of gas and a chimney. Disadvantage of the device is again use of a non-renewable source of fuel and high running cost.

A device for utilization of waste by low-temperature plasma is known, according to the state of the art. It is possible to use it in any industrial sector for elimination of dangerous liquid organic waste, for example in the petrochemical industry. A plasmadynamic reactor for processing organic liquid waste has airtight cover with accessories for inlet of polluted water and opening for outlet of purified water, where the cathode and the anode are installed, which are connected to a power source. Furthermore, an ignition electrode is installed in the reactor body, closed in an isolating cover and connected to a pulse power source. Disadvantage of the device is limitation of usable recyclable materials and difficulty of sealing of the reactor, because of thermal erosion of its building materials.

The document RU83123 presents a device for utilization of waste by plasma, which comprises a chamber for decomposition of waste by plasma, an electrode for performing plasma, which is instated in the chamber, a system for leading gaseous products performed by the combustion and melting out, and a cooling system for cooling the gaseous products, as products of combustion and melting. The electrodes for forming plasma are adjusted with regards to possible change of direction and flow force of plasma. The technical aim of the device is an optimization of processes of utilization of waste by formed controlled flow of plasma and by thermal field of the chamber for plasma utilization of waste. Disadvantage of the method is mechanical displacement of the electrode for forming plasma, which complicates the construction of the chamber for thermal decomposition of the waste and decreases reliability and controllability of the technical process during use of the device.

Document US19840611541 presents a method of thermal destruction of waste by electrical plasma arc flame, whereas the problem to cross over the emission of injurious emission to the environment is solved by neutralization of dangerous compounds by alkaline solution, which is added to a decomposition zone of waste by spraying at its periphery. Disadvantage of the method is use of huge amount of a neutralization agent, difficulty to construct the area with uniformly spread agent for finalization of the neutralization process, and increase of energetic wastage caused by evaporation of water from the solution.

The document US20070837384 presents a method of processing waste by microwave plasma flame, where microwave radiation is used for preliminary drying of waste and subsequent combustion of the waste in the plasma flame. Microwave devices are arranged in the basement of a block of flats and it is possible to remove it by use of a trailer or another means of transport. Disadvantage of the method is number of steps of the technological process, where drying and combustion of waste in the plasma flame is processed in different phases of the method and by use of different devices. Moreover, use of the microwave radiation is without initiation of plasma, which is strong absorber of electromagnetic waves, and requires use of a difficult and demanding provisions, such as a radio-hermetic device and continuous monitoring of electromagnetic radiation into its surrounding.

The document WO2004ES00550 presents a method and a device for liquidation of flying organic substances by microwave plasma. The method uses a system, where the flying organic substances are focused directly to the plasma at the axis of the plasma flame and together with a gas, which performs the plasma and fills inner volume of a reactor, where the process of decomposition of the flying substances is performed. The device comprises an area for inlet of the flying organic substances, an area for forming a plasma, a reactor, a gas pump for pumping and many other additional components. Disadvantage of the method is limitation of kinds of waste suitable for its recycling, and ways for feeding different kinds of waste into the thermochemical chamber.

Another solution is a device for liquidation of solid municipal waste by use of an electrical electrode for forming a plasma arch. The device relates to utilization of solid municipal waste, petroleum industry waste, chemical industry waste, medical waste, energetic waste, etc. The technical aim of the presented device is an optimization of a process for plasma-processing of waste by controlled plasma flow and thermal field of a chamber for decomposition of waste by plasma. The device comprises a chamber for decomposition of waste by plasma, electrodes for forming plasma, which are arranged in the chamber, a system for leading gaseous combustion products and meltage out, a system for cooling the gaseous combustion products and the meltage. The electrodes for forming the plasma are configured with regards to possible movements, which enable changes of direction and force of the plasma flow. The electrodes are arranged on the surrounding of the chamber for decomposition of waste by plasma at different levels as well on the level for collecting of the meltage. Disadvantage of the device is, that optimization of the thermal gradients in the chamber for gasification is processed during mechanical setting of the device for leading the plasma flame into the chamber for thermal decomposition, which is complication for operation of the device and doesn't provide a flexible configuration of the thermal field inside the chamber.

The document RU2153781 presents a microwave plasma burner comprises a magnetron with a power supply, a waveguide resonator, a device for supply of microwave energy, a coaxial system for supply of microwave radiation, a system for feeding a usable gas. The resonator is configured as a part of a rectangle waveguide with an opening at its wide wall for leading a microwave radiation generated by magnetron, and with openings for introduction of a loop for connection of the resonator with a coaxial tract for supply of microwave ray. The coaxial tract comprises metal exterior electrodes, e.g. made of copper, in the form of the cylinder, and a central tube made of metal, e.g. cooper, connected to a feeding system of a usable gas, where the electrode is continuation of the loop connection. The last part of the central tube is performed as the Lavalo's nozzle isolated from the exterior electrode by silicon inner. The exterior electrode is equipped by conductive nozzle for forming a flame, and by microwave radiation protection. The hollow cylinder is provided with cut-outs or openings performed on its side surface. Disadvantage of the device is, that the construction not allows to create an industrial microwave plasma burner, which uses a microwave generator of energy up to 100 kW at continual running, because admissible energy transmitted by the coaxial waveguide is limited by size of the coaxial tract and by high losses of heat in a dialectical isolating sealing, which leads to its destruction.

The document U.S. Pat. No. 3,814,983 presents a slowing system, that comprises a waveguide-band transmission for interconnection of the system with a generator, and for letting waves from the generator into the plasma system, Furthermore it comprises a bridge band interconnected with the waveguide-band transmission, two parallel band waistlines interconnected by its one end with the bridge band, where the band waistlines are flat plates, where one of its sides is provided with tenons arranged side by side along the axis of the band waistlines with orientation in a such way, that the tenons arranged on the one side of the first band waistline are placed in turns between the tenons arranged on the one side of the second band waistline.

Aim of the invention is to present a gasification device and plasma shutter with a slowing system of the gasification device, which is able to eliminate the above mentioned disadvantages.

Feature of the Invention

The above mentioned disadvantages are considerably eliminated by use of a microwave plazma slowing system 15 for a plasma shutter 6 comprises a waveguide-band transmission 16 for interconnection of the system with a generator 5, and for letting waves from the generator 5 into the plasma shutter 6, a bridge band 17 interconnected with the waveguide-band transmission 16, two parallel band waistlines 18, interconnected by its one end with the bridge band 17, where the band waistlines 18 are flat plates, where one of its sides is provided with tenons 19 arranged side by side along the axis of the band waistlines 18 with orientation in a such way, that the tenons 19 arranged on the one side of the first band waistline 18 are placed in turns between the tenons 19 arranged on the one side of the second band waistline 18, the band waistlines 18 are provided at the other end by mutually separated lockable electromagnetic oscillators 20, where the position of the lockable electromagnetic oscillators 20 defines an exact point of reflection of a waves to perform its maximal amplitude by count up of a direct and a reflected waves, the band waistlines 18 are broadened in the direction from the waveguide-band transmission 16 and narrowed before the lockable electromagnetic oscillators 20, and intended for leading the direct waves Y from the bridge band 17 to the lockable electromagnetic oscillators 20, the tenons 19 are mutually separated in distance $\lambda_B/2$, where $\lambda_B$ is a longitude of the wave at the exit of the waveguide-band transmission 16, and positioned in a path of the reflected waves Z, which is leading from the lockable electromagnetic oscillator 20 to the bridge band 17, the bridge band 17 attends to split a coming wave to two identical waves shifted by 180°, where each one of the waves spreads on a different band waistline 18.

The above mentioned disadvantages are considerably eliminated also by use of a plasma shutter 6 comprises the microwave plazma slowing system 15 according to the claim.

In an advantageous embodiment the microwave plazma slowing system 15 is arranged at the axis of the plasma shutter 6.

In another advantageous embodiment the further comprises two to twelve independent solenoids 21 for directing a plasma flow 13, which is coming out of the plasma shutter 6.

The above mentioned disadvantages are considerably eliminated also by use of a gasification device comprises a loader 1 of a solid substance with separated fractions, connected to a grinder 2 of the solid substance, connected to a hopper 3 of the solid substance, connected to a gasification chamber 4 for gasification of the solid substance, to which also a generator 5 for supply of microwave power is connected, where the generator 5 comprises a power source, a waveguide and an automatic control system for supply of the microwave energy, where the output of the gasification chamber 4 comprises a scrubber 7 for cleaning of entering synthetic gas out of particles of mechanical additives, which is connected to a plasma catalytic flue gas cleaning unit 8 for delicate cleaning of the synthetic gas, which is connected to a column 9 for fast cooling of the synthetic gas, to prevent recombination of danger chemical substances, the output of the gasification chamber 4 furthermore comprises a reactor 10 for homogenization of the residues performed by cooling of a melted substance, connected to a feeder 11 for collecting of the cooled coke residues, where furthermore comprises the plasma shutter 6 according to any of the claims.

In an advantageous embodiment the loader 1 of the solid substances is a device for preparation of the solid substances with a magnetic separator of metal.

In another advantageous embodiment the grinder 2 of the solid substances is designed for grinding particles to size from 0.80 to 10 mm.

In another advantageous embodiment the hopper 3 of the solid substances comprises a tube or a drawing cannel, for drawing a primary gas.

In another advantageous embodiment it comprises both the hopper 3 for supply solid particles, and a sprayer 12 for supply liquid substances.

The above mentioned disadvantages are considerably eliminated also by use of a use of the gasification device according to any of the claims for thermochemical conversion of organic substances.

DESCRIPTION OF THE DRAWINGS

The invention will be further explained by use of drawings, in which.

PREFERRED EMBODIMENTS OF THE INVENTION

Figure 1:
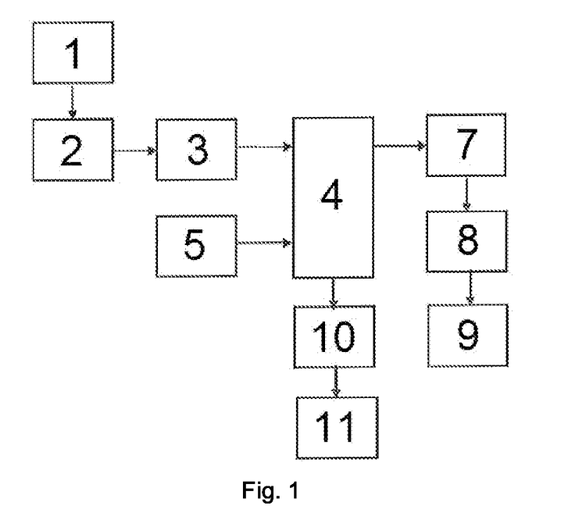
FIG. 1 presents a block diagram of the gaseous device according to the invention.

The gasification device for gasification and thermochemical destruction of a solid substance according to the invention presented in FIG. 1 comprises:
- a loader 1 of a solid substance with separated fractions, connected to
- a grinder 2 of the solid substance, connected to
- a hopper 3 of the solid substance, connected to
- a gasification chamber 4 for gasification of the solid substance, to which also
- a generator 5 for supply of microwave power is connected, where
- the generator 5 comprises a power source, a waveguide and an automatic control system.

The output of the gasification chamber 4 comprises:
- a scrubber 7 for cleaning of entering synthetic gas out of particles of mechanical additives, such as ash and dust, which is connected to
- a plasma catalytic flue gas cleaning unit 8 for delicate cleaning of the synthetic gas, which is connected to
- a column 9 for fast cooling of the synthetic gas, to prevent recombination of danger chemical substances, e.g. dioxin, furan etc., which are decomposed during gasification of the solid substances.

The output of the gasification chamber 4 furthermore comprises:
- a reactor 10 for homogenization of residues performed by cooling of a melted substance, and
- a feeder 11 for collection of the cooled coke residues.

Figure 2:
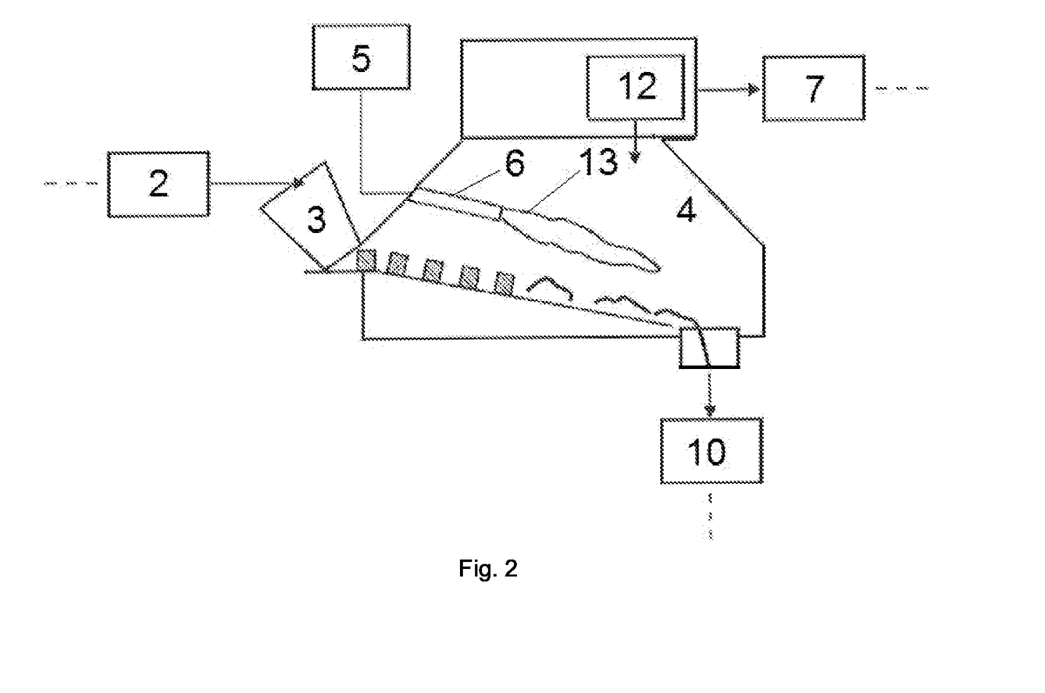
FIG. 2 presents in detail a schematic view of the gaseous chamber of the gaseous device presented in FIG. 1.

The gasification chamber 4 presented in detail in FIG. 2, comprises a plasma shutter 6 intended to supply required amount of heating energy, which ensures performance of controlled electrodeless continual microwave plasma flow 13, i.e. a beam of rays, comprises a microwave plazma slowing system 15 according to the invention arranged axially with the plasma shutter 6.

Advantageously, the loader 1 of the solid substances is a device for preparation of the solid substances with a magnetic separator of metal.

Advantageously, the grinder 2 of the solid substances is designed for grinding particles to size from 0.80 to 10 mm.

Advantageously, the hopper 3 of the solid substances comprises a tube, respectively a drawing cannel, for drawing primary gas.

The performance of the plasma shutter 6 may differs accordingly to the method how voltage of electromagnetic field sufficient for forming a freely gliding plasma discharge, i.e. an effective plasmoid, is obtained.

Gasification of the organic part of the solid substances is performed within atmospheric pressure and within temperature from 1000° C. to 1500° C., whereas a synthetic gas with pyrolytic liquid is created. A thermic machining of inorganic results together with simultaneous creating of liquid slag is processed in the temperature range from 1500° C. to 2000° C.

The reactor 10 and the feeder 11 are designed for leading of a molted coke away, which is performed after thermic processing of inorganic parts of the solid substances.

An example of use of the gasification device according to the invention for gasification of waste is presented below. The term "waste" generally means any material with any percentage of solid, liquid or fluid substances.

FIG. 2 presents waste in the pre-prepared form, i.e. after its separation, grinding, pressing or briquetting, which is entering the gasification chamber 4 via the hopper 3, whereas its liquid fraction, i.e. the filtered fraction, separated out from the main mass of the solid part performed during preparation of the waste for gasification, and also separated out from the liquid substance of the waste itself, e.g. used cleaning water, are fed by sprayer 12 in a direction perpendicular to the axis of spreading of the microwave plasma flow 13. The sprayer 12 is installed on the upper side of the gasification chamber 4 and provided with a nozzle. Such feeding method of the liquid substances of the waste and the cleaning water ensures complete outcome of the synthesis gas, because vapor of water created when the liquid reaches the zone of the microwave plasma flow 13, is uniformly distributed in the gasification chamber 4.

The gas friction of the waste coming through a ventilation device into the gasification chamber 4 during provisional preparation of the waste, and the gaseous waste too, are used as gas for performance of the plasma, by its feeding directly into the gasification chamber 4 by the above mentioned sprayer 12, by the same way as primary gas or vapor of water. So, organic molecular chains, which are presented in the gas, are fed directly into the zone of the plasma core with temperature from 2000° C. to 4000° C., by which the chains are decomposed to single molecules or ions.

Methane and ammoniac contained in the gaseous part of the waste and also in a Sulphur compounds, pathogens, nutritive and other harmful substances, which are created during its decomposition, are used as the plasma gas of the gasification chamber 4, where the dangerous chemical substances are decomposed to create simple substances and leaves the gasification chamber 4 in the form of the synthesis gas, which is later on used for generation of electrical energy.

Figure 3:
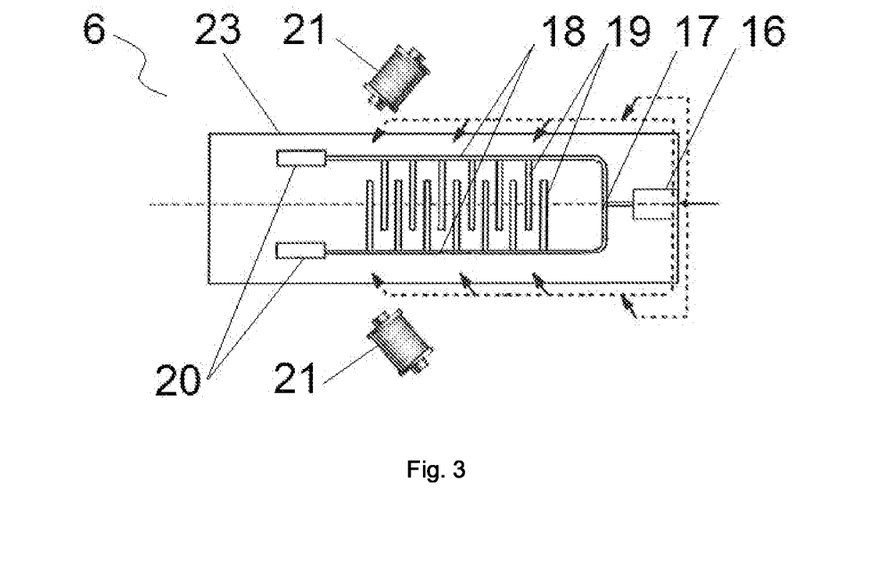
FIG. 3 presents a drawing of the plasma shutter with the slowing system according to the invention.
Figure 4:
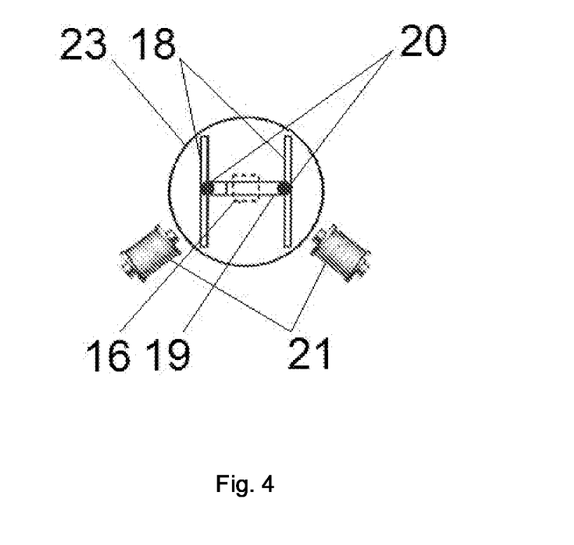
FIG. 4 presents a front view of the plasma shutter with the slowing system according to the invention.
Figure 5:
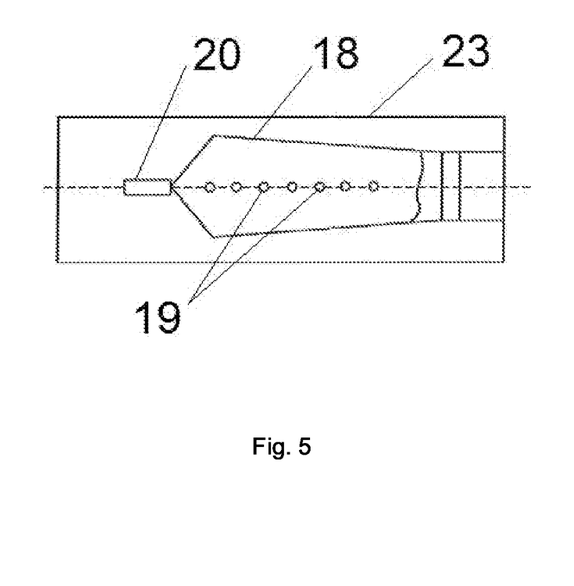
FIG. 5 presents a side view of the plasma shutter with the slowing system according to the invention.
Figure 6:
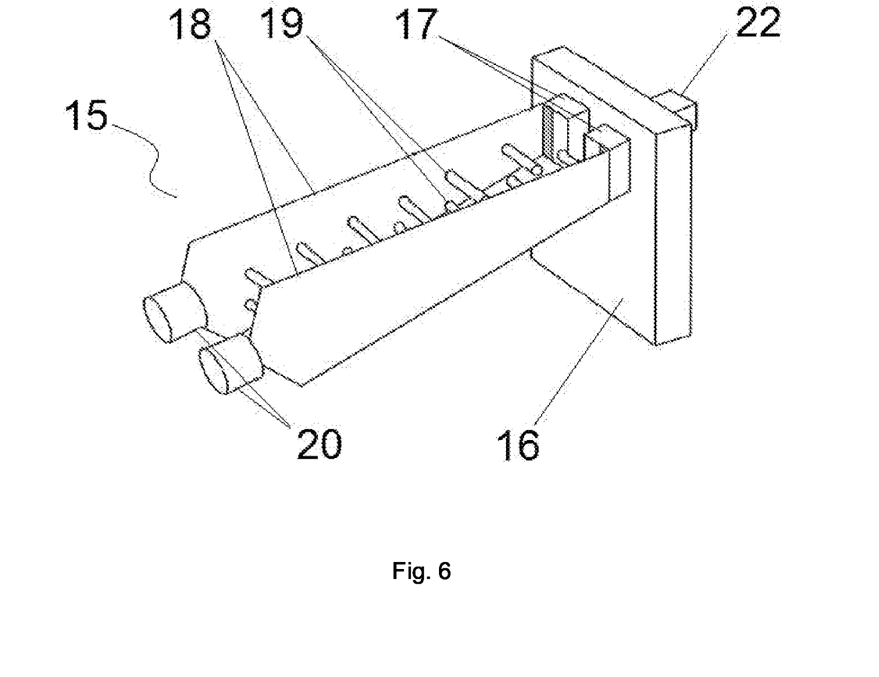
FIG. 6 presents a perspective view of the slowing system of the plasma shutter according to the invention.

Orientation of the plasma shutter 6 in the gasification chamber 4 is in such way, that the temperature gradient of the plasma flow 13 ensures continual heating of the solid waste and leads it to the gasification chamber 4 in a form of a direct flow of the plasma flow 13. A non-mechanical directing of the axis of the plasma flow 13 into the required direction is performed by moving of the plasma in magnetic field, which is co-axial with the axis. The magnetic field is generated by two to twenty independent solenoids 21, advantageously by three, as figured in FIGS. 3 and 4. It means that electrical conductivity of the plasma flow 13 and energy of the plasma flow 13 is possibly modified in a direction of the flow. By the use of the magnetic modification for directing of the plasma flow 13 a continual temperature gradient in the working cavity of the gasification chamber 4 is reached, which ensures complete gasification of the organic waste. Furthermore, change of the temperature gradient in case of change of character of the load of gasification chamber 4, i.e. volume and kind of waste, is ensured, which is essential advantage compare to mechanical way of change of a direction of the plasma flow 13, which ensures a physical modification of a position of the plasma shutter 6, which means intervention to the whole device, its shutdown etc.

The microwave plazma slowing system 15 of the plasma shutter 6 according to the invention in the detail presented in FIGS. 3 to 6, comprises:
- a waveguide-band transmission 16,
- a bridge band 17,
- a band waistline 18,
- tenons 19,
- a lockable electromagnetic oscillator 20, i.e. a mirror,
- solenoids 21, and
- a reflected waves outlet 22, for reflecting the waves to the circulator.

The waveguide-band transmission 16, i.e. an output node of the waveguide, is intended to lead the wave from the generator 5 to the plasma shutter 6, where the energy of the generator 5 led by the waveguide, is simultaneously divided in such way, it performs two identical parts of the same wave, where each of the parts of the wave spreads on one side of the band waistline 18.

Figure 7:
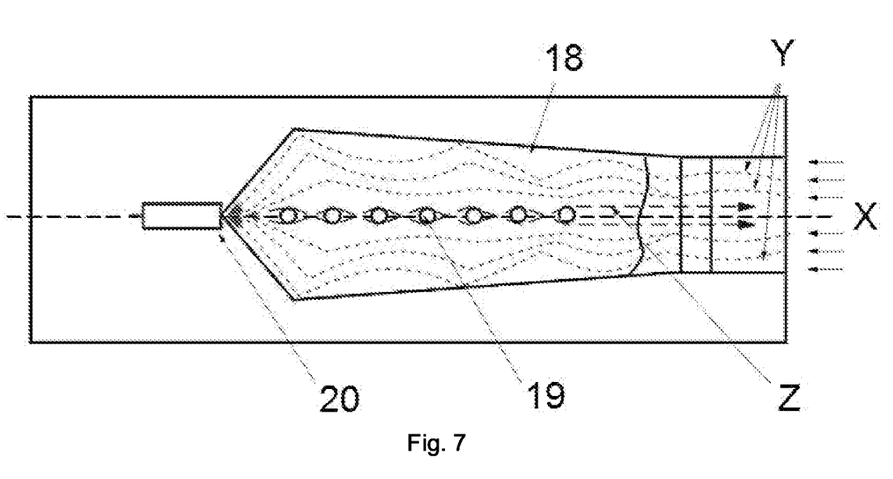
FIG. 7 presents a principle of movements of waves in the gaseous shutter with the slowing system according to the invention.

The band waistline 18 is a flat plate of a specific shape, which broads on its beginning, i.e. on the exit from the waveguide-band transmission 16, and narrows on its end, i.e. before the lockable electromagnetic oscillator 20. The band waistline 18 is provided with the tenons 19 positioned side by side in distance $\lambda_B/2$ along the axis of the plasma shutter 6 and orientated in such way, that the tenons 19 arranged on the one side of the first band waistline 18 are placed in turns between the tenons 19 arranged on the second band waistline 18 with a minimum distance between them and with maximum overlapping of whole or of a part of length of the tenons 19. The number of the tenons 19 on one side is even number and the number of the tenons 19 on the other side is odd number, i.e. a phase of a microwave energy/wave of the wave on the first band waistline 18 is opposite to a phase of a microwave energy/wave of the wave on the second band waistline 18. Because of that, energy of the electromagnetic wave is rising. The result of the interaction is count up of bounds of direct and reflexed waves, which is effected in the area of the lockable electromagnetic oscillator 20. The effect of repeated amplification of the microwave energy is sufficient for performance of the freely gliding microwave plasma flow 13 by use of energy under 30 KV/cm. The movements of the waves X coming from the generator 5, the direct waves Y and the reflected waves Z in the plasma shutter 6 are depictured in FIG. 7.

At the end of the plasma shutter 6 the positioning system of the band waistline 18 is arranged, i.e. the lockable electromagnetic oscillator 20, which ensures setting of an exact point of a reflection of the wave, by which a maximum amplitude is achieved as a result of the counting up of the direct and the reflected waves.

The size of the slowing system 15 and of its single parts are determined by exact counting, to get a minimal stationary wave at the place of the waveguide-band transmission 16 and a maximal stationary wave only in the area of the mirror, i.e. in the area of the lockable electromagnetic oscillator 20, after the counting up of the bounds of the direct and the reflected waves, which are spreading along the band waistline 18.

The longitude of the band waistline 18 is determined with regards to an electrical longitude of a unique periodical part of the wave, which is equal to an equitation $t=3/4\,\lambda_B$, where $\lambda_B$ is a longitude of the wave at the exit of the waveguide-band transmission 16. Its determination is based on dissipative characteristics of a balanced plasma, which is rising in the area of the microwave plazma slowing system 15. The phase shift of a wave during the oscillation in the band waistline 18 has to be $\lambda_B/2$, i.e. 180°, because the microwave plazma slowing system 15 is composed of two identical parts, i.e. the band waistline 18 with the tenons 19 on its sides, where the tenons 19 of one comb are alternated with the tenons 19 of the opposite comb, which improves mutual breaking of reflected waves. Because of that, fast multiplication of the electromagnetic waves in a defined spatial point, where electrodeless discharge UHF plasma is create, when electromagnetic field having voltage 30 kV/cm is presented, which coming into the form of a free plasma cloud, which is called a plasmoid. By interaction of the flow of gas the plasma cloud is led into the gasification chamber 4, which is called a reactor, in the form of the microwave plasma flow 13.

The whole construction of the microwave plazma slowing system 15 consists two nodes of a stationary wave, i.e. points of maxima. One of them is located in the area of the lockable electromagnetic oscillator 20 and the second end is located in the area of the source of electromagnetic waves, i.e. the generator 5. The minimum of the stationary wave is at the waveguide-band transmission 16.

The microwave plazma slowing system 15 is arranged in a protective case 23 of a cylindrical shape, which is the body of the plasma shutter 6. Such performance ensures stiffness of the construction and comprises outputs of tubes for letting/blowing in air or water vapor.

The method of the gasification is described below:

When waste is received, where the term "waste" means again only an example of all possibly received solid substances usable for the gasification, preparation for gasification by its separation onto individual fractions is carried out, e.g. by melting or pressing, after which the solid fractions are coming through the hopper 3 into the gasification chamber 4 comprising a nozzle of the plasma shutter 6. Performance of the plasma flow is ensured by generating microwave energy by the ultrahigh frequency wave generator 5. By heating of the waste up to temperature from 1000° C. to 1500° C. the organic component is thermally decomposed, and synthetic gas with pyrolytic fluid is created. The separation of the gas from the liquid substance starts at the moment, when sufficient temperature for the separation of vapor from light fractions of pyrolytic liquid in the gasification chamber 4 is reached. At the time of rising of heating temperature of the waste up to 1500° C. to 2000° C. the inorganic components of the waste are melted and slag melt is performed, which is removed from the gasification chamber 4 by the homogenizator 10 to the feeder 11 of the slag. The performed synthetic gas is guided into a system for gas cleaning, which comprises the scrubber 7 for rough cleaning of solid particles, e.g. dust and ash, and furthermore it comprises the plasma catalytic flue gas cleaning unit 8 for separating the dangerous chemical substances, in particular halogen dioxides, dioxide substances, furans, etc. Dioxins and furans are difficult to be decomposed at low temperature. It is necessary to reach temperature at least 750° C. It is completely decomposed at temperature 1000° C. The complete decomposition of dioxins and furans is possible only if it is exposed to temperature from 1200° C. to 1300° C. for 2 to 3 seconds. For the reason, that recombination of dangerous substances has to be avoided, the gas having temperature 1000° C. to 1200° C. is guided to the column 9 of fast cooling, where the temperature is lowered to 70° C.

to 110° C. in 2 to 3 seconds. Furthermore, the performed gas, which is mainly comprising the carbon oxide (CO) and the hydrogen ($H_2$), is useable for generating electrical energy or for its direct sell as a fuel.

Microwave energy from the generator 5 passes through the waveguide-band transmission 16 along the band waistline 18, which narrows continuously in the direction of the wave, to the lockable electromagnetic oscillator 20. The microwave diffuses from the generator 5 over the surface and the edge of the band waistline 18 in fact without any barriers to the lockable electromagnetic oscillator 20 with a construction, which ensures setting and fixation of the direction of the electromagnetic oscillation. In the termination point the electromagnetic wave is reflected. Because of the small plane for the reflection, the reflected wave has a form and a visual shape of a very thin beam, which is after its reflection blocked and slowed down by the tenons 19 arranged continuously along the axis of the band waistline 18. By that way the track of the reflected wave back to the beginning of the oscillation is extended together with extension of the wavelength. The identical band waistline 18 with the tenons 19 is arranged in the opposite direction and the oscillation performed there is shifted by $\lambda_B/2$, i.e. 180°. Because of the reflection from mechanical barriers, i.e. tenons 19, and because of mutual blocking by the electromagnetic waves itself, the wave is slowed down.

Thanks to the microwave plazma slowing system 15 according to the invention, used in the plasma shutter 6 in combination with the gasification chamber 4 constructed for feeding of different fractions, i.e. solid fractions, liquid fractions and gaseous fraction, the following positive benefits are reached:

- feeding of solid substances in a form of briquettes ensures complete gasification of its organic part,
- the way of feeding of the liquid fraction and cleaning water in form of water vapor increases and accelerates decomposition grade of the organic part of the solid substances,
- by the use of the gaseous fraction as a gas for co-creation of the plasma it is no longer necessary to take the fractions out via a ventilation device, and no need to clean it before its entering the atmosphere,
- the effectivity of transformation of the electrical energy to the heating energy is up to 98%,
- it is possible to use is locally in a form of a container device of predetermined size, with regards to the size and type of processed solid substances,
- decomposition of solid substances and inorganic residues at temperatures from 700° C. to 2000° C. is ensured,
- with regards to the technological use the microwave plasma flow can be configured by configuration of its direction, into a form of a very narrow beam similar to a flame, or configured into a form of a freely gliding discharge, i.e. a plasma fog, inside the gasification chamber,
- processing of solid substances, e.g. waste or worn out polymers, is possible by use energy from 100 kW; since the day microwave plasma devices of a resonator type according to the state of the art enable to use energy only in a range from 5 to 10 kW,
- electrodes and additional combustible substances, e.g. gas, masut, diesel, which pollute final products of the gasification by dangerous substances, are missing. It means, that the device according to the invention presents the cleanest way of processing of a material, both in an ecological view and in a view of possible further use of the created synthesis gas.

By the device according to the invention it is possible to create up to 2500 $m^3$ of synthesis gas of energy 8440 kW by use only one tune of dry separated mass. 40% of the energy is possible to use for generating electrical energy for customers and for distribution, and up to 60% for production of warm. Furthermore, the method of microwave plasma gasification ensures to get synthesis gas with the hydrogen-monooxide number higher than 1, which is not possible by any known technology according to the state of the art. The presence of high amount of hydrogen in the reacting volume decelerates performance of gas components of sulphur, phosphorus, chlorine and nitrogen. It ensures to get heating synthesis gas with calorific volume up to 20000 $kJ/m^3$ with minimal percentage of ballast. The advantage of the invention is a possibility of use of such gas not only for production of electricity, but also for transport, storage and for production of synthetic fuel for a motor. Furthermore, a ration of amount of a solid residue, i.e. slag, after gasification, to volume of the starting material is 1:400. An average energetic balance primarily depends on a morphological composition of the material and on content of carbon, which is bases of the gasified material. For example, the content of carbon in wood is approximately 40%, in peat it is approximately 55%, in slate it is approximately 60%, in brown coil it is approximately 65%, in black coil it is approximately 80%, in polymers it is approximately 85%, in mazut and in yarn it is approximately 90% and in antacid it is approximately 95%.

It is necessary to take into account, that main components of the fuel, i.e. gasified solid substances, which are carriers of energy, is carbon (C) and hydrogen ($H_2$). During burning of 1 kg of the carbon approximately 34000 kJ of energy is released, and during burning of 1 kg of the hydrogen approximately 125000 kJ of energy is released. Another components of fuel, e.g. sulphur (S), oxygen ($O_2$), nitrogen ($N_2$), sulphur dioxide ($SO_2$), dioxide of carbon ($CO_2$), oxide of nitrogen (NOx), mineral particles, humidity ($H_2O$), are non-flammable ballast of the fuel, which significantly reduce useable energetic calorific value of the fuel. Because the components has to be melted and its humidity evaporated, consumption of the fuel for its heating is rising. For transformation of 1 kg of humidity into form of vapor approximately 2500-3000 kJ is necessary.

If a technology according to the state of the art is used for direct combustion of a carbon material, e.g. a steam boiler and a vapor generator, by combustion of one tune of wood only approximately 40 kW of electrical energy and 60 kW of thermal energy is generated, i.e. approximately 100 kW of energy in total, or by combustion of one tune of coil only approximately 120 kW of electrical energy and 180 kW of thermal energy is generated, i.e. approximately 300 kW of energy in total, because whole content of the burned products is a non-flammable ballast supplied by permanently added air into the boiler, which is itself producer of another ballast.

The gasification device according to the invention is useable for thermochemical destruction, i.e. gasification, of hydrocarbons contained in various organic substances, e.g. low-quality energetic coil, worn out oil substances, e.g. engine and technical oil, hospital waste and dangerous waste, which are comprising carbon components, solid municipal waste and worn out polymers, for production of synthesis flammable gas, in the other words, for generating clean energy.

Microwave plasma slowing system 15 for a plasma shutter 6 comprises a waveguide-band transmission 16 for interconnection of the system with a generator 5, and for letting waves from the generator 5 into the plasma shutter 6, a bridge band 17 interconnected with the waveguide-band transmission 16, two parallel band waistlines 18, interconnected by its one end with the bridge band 17, where the band waistlines 18 are flat plates, where one of its sides is provided with tenons 19 arranged side by side along the axis of the band waistlines 18 with orientation in a such way, that the tenons 19 arranged on the one side of the first band waistline 18 are placed in turns between the tenons 19 arranged on the one side of the second band waistline 18, where the band waistlines 18 are provided at the other end by mutually separated lockable electromagnetic oscillators 20, where the position of the lockable electromagnetic oscillators 20 defines an exact point of reflection of a waves to perform its maximal amplitude by count up of a direct and a reflected waves, the band waistlines 18 are broadened in the direction from the waveguide-band transmission 16 and narrowed before the lockable electromagnetic oscillators 20, and intended for leading the direct waves Y from the bridge band 17 to the lockable electromagnetic oscillators 20, the tenons 19 are mutually separated in distance $\lambda_B/2$, where $\lambda_B$ is a longitude of the wave at the exit of the waveguide-band transmission 16, and positioned in a path of the reflected waves Z, which is leading from the lockable electromagnetic oscillator 20 to the bridge band 17, the bridge band 17 attends to split a coming wave to two identical waves shifted by 180°, where each one of the waves spreads on a different band waistline 18.

What is claimed is:

1. Microwave plasma slowing system for a plasma shutter, comprising:
    a waveguide-band transmission configured to interconnect the system with a generator and configured to let waves from the generator into the plasma shutter,
    a bridge band interconnected with the waveguide-band transmission,
    two parallel band waistlines, interconnected by its one end with the bridge band,
    where the band waistlines are flat plates, where one of its sides is provided with
    tenons arranged side by side along the axis of the band waistlines with orientation in a such way, that the tenons arranged on the one side of the first band waistline are placed in turns between the tenons arranged on the one side of the second band waistline, wherein
    the band waistlines are provided at the other end by mutually separated lockable electromagnetic oscillators, where the position of the lockable electromagnetic oscillators defines an exact point of reflection of a waves to perform its maximal amplitude by count up of a direct and a reflected waves,
    the band waistlines are broadened in the direction from the waveguide-band transmission and narrowed before the lockable electromagnetic oscillators,
        and intended for leading the direct waves Y from the bridge band to the lockable electromagnetic oscillators,
    the tenons are mutually separated in distance $\lambda_B/2$, where $\lambda_B$ is a longitude of the wave at the exit of the waveguide-band transmission,
        and positioned in a path of the reflected waves Z, which is leading from the lockable electromagnetic oscillator to the bridge band,
    the bridge band attends to split a coming wave to two identical waves shifted by 180°, where each one of the waves spreads on a different band waistline.

* * * * *